(12) United States Patent
Endo

(10) Patent No.: US 7,428,063 B2
(45) Date of Patent: Sep. 23, 2008

(54) OVERLAY MEASUREMENT APPARATUS

(75) Inventor: Takeshi Endo, Yokohama (JP)

(73) Assignee: Nikon Corporation, Tokyo (JP)

( * ) Notice: Subject to any disclaimer, the term of this patent is extended or adjusted under 35 U.S.C. 154(b) by 18 days.

(21) Appl. No.: 11/415,195

(22) Filed: May 2, 2006

(65) Prior Publication Data

US 2006/0274312 A1 Dec. 7, 2006

(30) Foreign Application Priority Data

May 13, 2005 (JP) ............................. 2005-140753

(51) Int. Cl.
*G01B 11/14* (2006.01)
(52) U.S. Cl. .................................................... 356/622
(58) Field of Classification Search ......... 356/399–401, 356/601, 622
See application file for complete search history.

(56) References Cited

U.S. PATENT DOCUMENTS

| | | | |
|---|---|---|---|
| 6,716,559 B2 * | 4/2004 | Leidy et al. | 430/22 |
| 7,170,604 B2 * | 1/2007 | Sezginer et al. | 356/400 |
| 2003/0063278 A1 * | 4/2003 | Zaidi | 356/401 |
| 2003/0160960 A1 * | 8/2003 | Noguchi et al. | 356/401 |
| 2004/0023138 A1 * | 2/2004 | Stacker et al. | 430/22 |

FOREIGN PATENT DOCUMENTS

JP        A 11-108626        4/1999

* cited by examiner

*Primary Examiner*—Tarifur R. Chowdhury
*Assistant Examiner*—Isiaka O Akanbi
(74) *Attorney, Agent, or Firm*—Oliff & Berridge, PLC (57) ABSTRACT

An overlay measurement apparatus can judge whether an overlay displacement found from an image is accurate. It has a first measuring unit that captures images of first and second marks formed in different layers of a substrate and finds an overlay displacement between the two marks based on the images formed with light with a measurement wavelength range, a second measuring unit that captures the images of the two marks formed with light with an evaluation wavelength range different from the measurement wavelength range and finds the overlay displacement between the marks based on the images formed with the light with the evaluation wavelength range, and a calculation unit that calculates an index for accuracy of the overlay displacement in the measurement wavelength range based on the overlay displacements in the measurement and evaluation wavelength ranges found by the first and second measuring unit.

9 Claims, 5 Drawing Sheets

(a) <u>11A</u>(overlay mark)

OVERLAY MEASUREMENT APPARATUS

CROSS REFERENCE TO RELATED APPLICATION

This application is based upon and claims the benefit of priority from Japanese Patent Application No. 2005-140753, filed on May 13, 2005, the entire contents of which are incorporated herein by reference.

BACKGROUND OF THE INVENTION

1. Field of the Invention

The present invention relates to an overlay measurement apparatus that performs an overlay inspection of each layer of a substrate in the manufacturing process of semiconductor devices, liquid crystal display devices, etc.

2. Description of the Related Art

An overlay measurement apparatus captures, for example, an image of each mark formed in an underlying layer and a resist layer of a substrate and finds an overlay displacement between the marks from the images, to perform an overlay inspection of each layer of the substrate. Further, To find an approximate value to an actual overlay displacement after etching processing, at the overlay inspection it corrects measurement error called WIS (Wafer Induced Shift) due to a substrate (for example, refer to Japanese Unexamined Patent Application Publication No. HEI 11-108626). WIS can be corrected by simple signal processing using a correction table created in advance.

The above-mentioned overlay measurement apparatus premises on an absolute stability of the manufacturing process. Because of this, a change in the manufacturing process due to a problem in processing conditions etc. makes it impossible to obtain an accurate overlay displacement even with the WIS correction. However, even when the problem occurs, the above-mentioned overlay measurement apparatus finds an overlay displacement through the same procedure without realizing the problem and regards it as accurate. This may cause a factor that reduces yield in the manufacturing process.

SUMMARY OF THE INVENTION

Therefore, an object of the present invention is to provide an overlay measurement apparatus which can judge whether or not an overlay displacement found from an image is accurate.

An overlay measurement apparatus of the present invention has a first measuring unit that captures images of a first mark and a second mark formed in different layers of a substrate and illuminated with light in a measurement wavelength range and finds an overlay displacement between the first mark and the second mark based on the images in the measurement wavelength range; a second measuring unit that captures the images of the first mark and the second mark illuminated with light in an evaluation wavelength range different from the measurement wavelength range and finds an overlay displacement between the first mark and the second mark based on the images in the evaluation wavelength range; and a calculation unit that calculates an index for accuracy of the overlay displacement in the measurement wavelength range according to the overlay displacement in the measurement wavelength range found by the first measuring unit and the overlay displacement in the evaluation wavelength range found by the second measuring unit.

Moreover, it is preferable that the second measuring unit sets the evaluation wavelength range on both of a short wave side and a long wave side of the measurement wavelength range, and finds the overlay displacement in each of the evaluation wavelength ranges. The calculation unit preferably calculates the index according to the overlay displacement in the measurement wavelength range and to respective overlay displacements in a plurality of the evaluation wavelength ranges.

Further, it is preferable that the calculation unit calculates as the index a difference between maximum and minimum values of the overlay displacements found by the first measuring unit and the second measuring unit.

Furthermore, it is preferable that the calculation unit calculates as the index a standard deviation of the overlay displacements found by the first measuring unit and the second measuring unit.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

The embodiment of the present invention is described below in detail using drawings.

An overlay measurement apparatus 10 (FIG. 1) in the present embodiment performs an overlay inspection of a resist pattern of a substrate 11 in the manufacturing process of semiconductor devices, liquid crystal display devices, etc. The substrate 11 is a semiconductor wafer or a liquid crystal substrate and is in a state after a resist layer is exposed/developed and before a predetermined material layer is processed (etching process). A plurality of measurement points are arranged on the substrate 11 for an overlay inspection, and an overlay mark 11A shown in FIG. 2 is formed at each measurement point. FIG. 2(a) is a top plan view and FIG. 2(b) is a cross-sectional view.

The overlay mark 11A is a double mark of Bar in Bar type and constituted of a square-shaped resist mark 31 that shows a reference position of a resist pattern and a square-shaped underlying mark 32 that shows a reference position of an underlying pattern. The resist mark 31 and the underlying mark 32 are formed in different layers of the substrate 11 and different in size from each other. In an overlay inspection, the position of each mark is detected and an overlay displacement between the underlying mark 32 and the resist mark 31 is measured.

Figure 1:
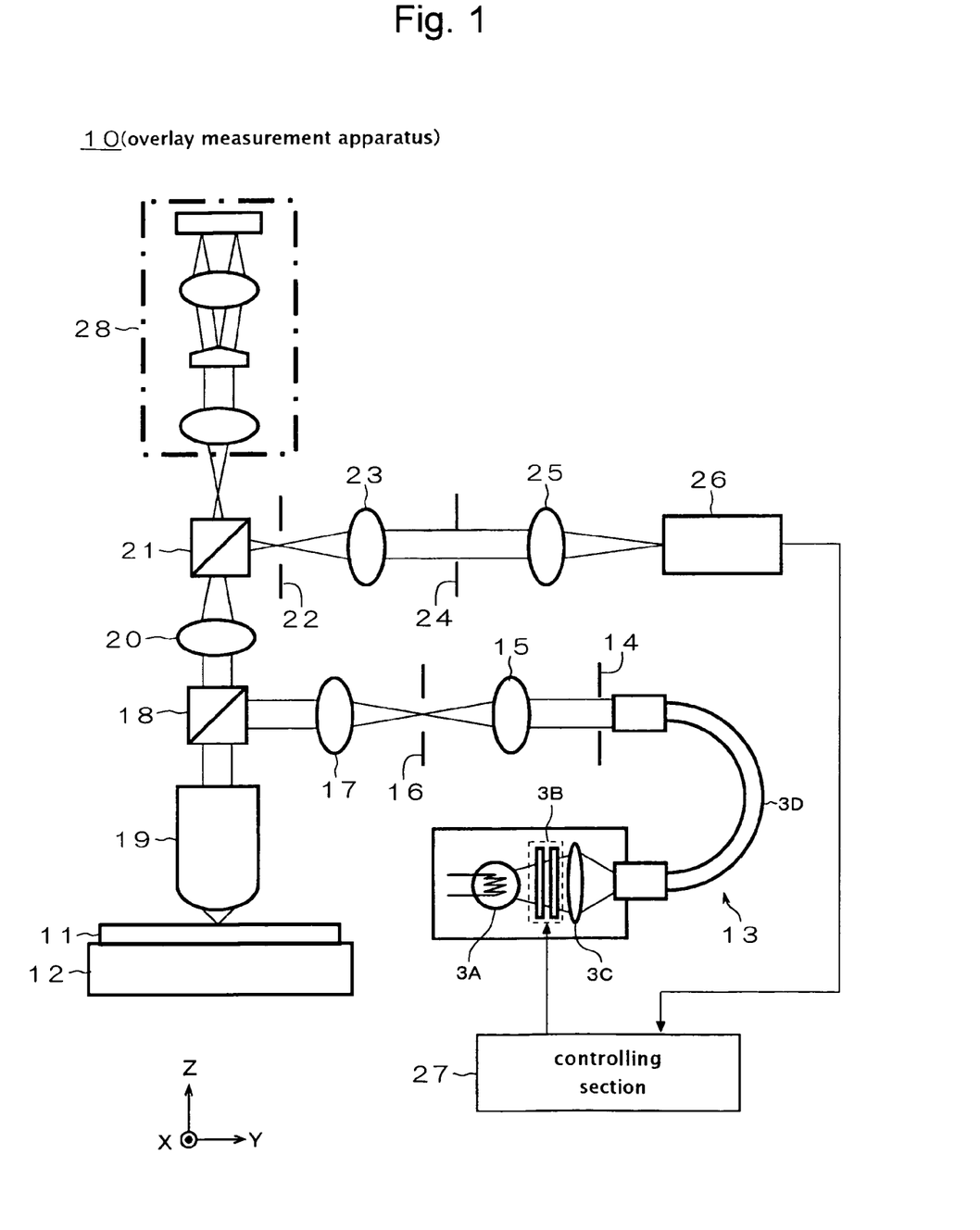
FIG. 1 is a diagram showing an entire configuration of an overlay measurement apparatus 10 in the present embodiment.
Figure 2:
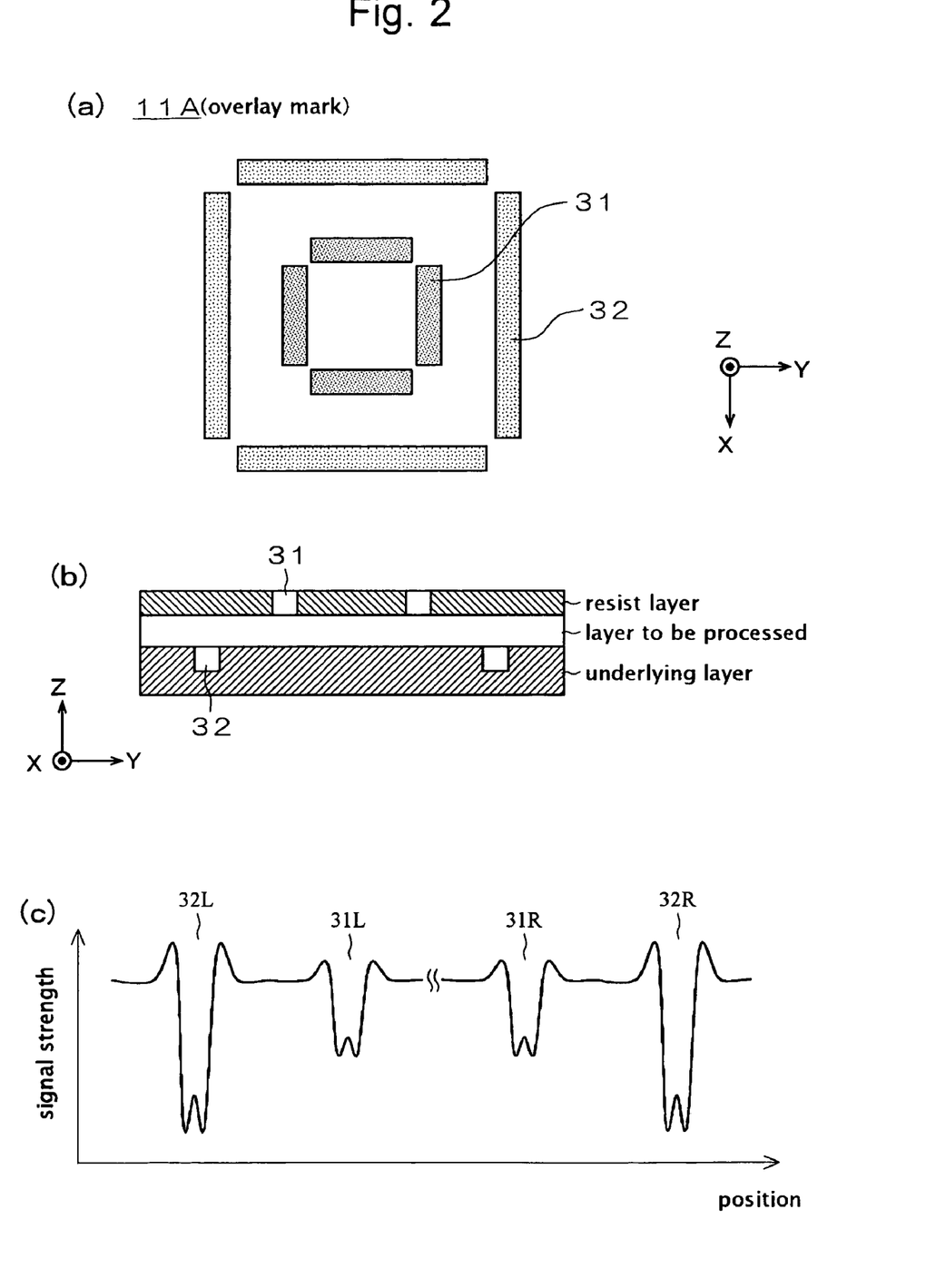
FIG. 2 is a diagram for showing configurations (a) and (b) of an overlay mark 11A and shapes (c) of edge waveforms 31L, 31R, 32L, and 32R.

The overlay measurement apparatus 10 in the present embodiment is provided with a stage 12 that supports the substrate 11, an illumination optical system (13-19), an imaging optical system (19-25), a CCD camera 26, a controlling section 27, and a focus detection section 28 of pupil division system, as shown in FIG. 1. Details of the focus detection section 28 of pupil division system are described in, for example, Japanese Unexamined Patent Application Publication No. 2002-40322, therefore, its explanation is omitted here.

The stage 12 moves the substrate 11 in the horizontal direction based on a recipe for an overlay inspection and sequentially positions the overlay mark 11A (FIG. 2) at each measurement point of the substrate 11 in an illumination area. In addition, the stage 12 moves the substrate 11 in the vertical direction based on the similar recipe or a focus signal from the focus detection section 28 and focuses the overlay mark 11A positioned in the illumination area on the image pickup plane of the CCD camera 26.

The illumination optical system (13-19) is constituted of a light source section 13, an aperture stop 14, a condenser lens 15, a field stop 16, an illumination relay lens 17, a beam splitter 18, and a first objective lens 19. Further, the light source section 13 is constituted of a light source 3A that emits light having a wide wavelength band (for example, white light), a wavelength switching mechanism 3B, a lens 3C, and a light guide fiber 3D.

The wavelength switching mechanism 3B is provided with a plurality of optical filters having different transmittance properties. The optical filter has eight transmission wavelength ranges, for example, (1) 530 nm-800 nm, (2) 530 nm-610 nm, (3) 530 nm-700 nm, (4) 700 nm-800 nm, (5) 470 nm-700 nm, (6) 470 nm-610 nm, (7) 470 nm-540 nm, and (8) 610 nm-700 nm.

Switching the optical filters of the wavelength switching mechanism 3B and inserting it into an illumination light path makes it possible to select light in a predetermined wavelength range from light with a wide wavelength band emitted from the light source 3A in accordance with the transmission properties of the optical filter. The light (in a predetermined wavelength range) after having passed through the optical filter of the wavelength switching mechanism 3B is guided to the aperture stop 14 via the lens 3C and the light guide fiber 3D.

The aperture stop 14 limits the diameter of the light emitted from the light source section 13 to a specific diameter. The condenser lens 15 gathers light from the aperture stop 14. The field stop 16 is an optical element that limits the illumination area of the overlay measurement apparatus 10. The illumination relay lens 17 collimates the light from the field stop 16. The beam splitter 18 reflects the light from the illumination relay lens 17 in the downward direction (toward the first objective lens 19).

In the above-mentioned configuration, the light (in a predetermined wavelength range) from the light source section 13 illuminates the field stop 16 uniformly via the aperture stop 14 and the condenser lens 15. Then, the light having passed through the field stop 16 is guided to the beam splitter 18 via the illumination relay lens 17 and reflected by its reflecting transmission plane, and thereafter guided to the first objective lens 19. The first objective lens 19 inputs the reflected light from the beam splitter 18 and gathers it onto the substrate 11 on the stage 12.

Due to this, the overlay mark 11A (FIG. 2) positioned in the illumination area of the substrate 11 on the stage 12 is illuminated vertically with light in a predetermined wavelength range having passed through the first objective lens 19 (epi-illumination). Then, diffracted light is generated from the illumination area of the substrate 11. The diffracted light includes the 0-th order diffracted light (that is reflected light), the positive and negative first order diffracted light, etc. The diffracted light from the substrate 11 is guided to the imaging optical system (19-25) to be described later.

The imaging optical system (19-25) is constituted of the first objective lens 19, a second objective lens 20, a beam splitter 21, a field stop 22, a first imaging relay lens 23, an aperture stop 24, and a second imaging relay lens 25. Between the first objective lens 19 and the second objective lens 20, the beam splitter 18 in the illumination optical system (13-19) is arranged. The beam splitters 18 and 21 are half prisms that perform amplitude separation of light.

The diffracted light generated from the substrate 11 is collimated by the first objective lens 19 and passes through the above-mentioned beam splitter 18 and enters to the second objective lens 20. The second objective lens 20 gathers diffracted light from the beam splitter 18. The beam splitter 21 transmits part of diffracted light from the second objective lens 20 and at the same time, reflects part of the rest. The light having passed through the beam splitter 21 is guided to the focus detection section 28.

The light reflected by the beam splitter 21 is gathered by the field stop 22 in the imaging optical system (19-25) and guided to the first imaging relay lens 23. The first imaging relay lens 23 collimates light from the field stop 22. The aperture stop 24 is arranged on a plane conjugate with a virtual pupil plane of the first objective lens 19 and limits the diameter of the light from the first imaging relay lens 23 to a specific diameter.

The second imaging relay lens 25 forms again an image of the light from the aperture stop 24 on the image pickup plane of the CCD camera 26.

The above-mentioned imaging optical system (19-25) forms an optical image of the mark on the image pickup plane of the CCD camera 26 when the overlay mark 11A (FIG. 2) of the substrate 11 is positioned in the illumination area.

The CCD camera 26 is arranged so that the image pickup plane thereof coincides with the image plane of the imaging optical system (19-25). The CCD camera 26 is an area sensor in which a plurality of pixels are arranged in two dimensions, and picks up an optical image of the overlay mark 11A on the substrate 11 and outputs an image signal to the controlling section 27. The image signal represents a distribution (luminance distribution) of the luminance value for each pixel of an optical image on the image pickup plane of the CCD camera 26.

At the time of overlay inspection the controlling section 27 controls the wavelength switching mechanism 3B of the light source section 13 in the illumination optical system (13-19) and sets a wavelength range of epi-illumination light to the substrate 11. Then it captures an image of the overlay mark 11A on the substrate 11 based on the image signal from the CCD camera 26, and performs image processing for overlay inspection on the image. The wavelength range of epi-illumination light is set according to, for example, a recipe by the controlling section 27.

In image processing for overlay inspection by the controlling section 27, the position of each of the resist mark 31 and underlying mark 32 that constitute the overlay mark 11A is detected and an overlay displacement between the resist mark 31 and the underlying mark 32 is calculated. The overlay displacement is a relative displacement of the position of center of gravity of each mark, representing an overlay displacement of a resist pattern with respect to the underlying pattern on the substrate 11. The overlay displacement is also called an "overlay measurement value". For calculation of an overlay displacement, it is preferable to obtain a value approximate to an actual overlay displacement after etching process by correcting WIS.

Further, in detecting the position of center of gravity of each mark, first, the signal strength of the image of the overlay mark 11A is integrated in the direction perpendicular to the measurement direction and a profile of the signal strength as shown in FIG. 2(c) is extracted. Then, an overlay correlation of the edge waveforms 31L and 31R corresponding to the resist mark 31 and the reflection waveform is found and a position at which the correlation value is maximum is determined as the position of center of gravity of the resist mark 31. The same calculation processing is performed for the edge waveforms 32L and 32R corresponding to the underlying mark 32.

Here, the underlying mark 32 has an ideal sectional shape as shown in FIG. 2(b), and the edge waveforms 32L and 32R of the profile thereof have symmetry (FIG. 2(c)), so that, when the position of center of gravity of the underlying mark 32 is detected by finding the overlay correlation with the above-mentioned reflection waveform, an accurate overlay displacement is obtainable by finding a relative displacement between the position of center of gravity and the position of center of gravity of the resist mark 31 and correcting WIS.

Figure 3:
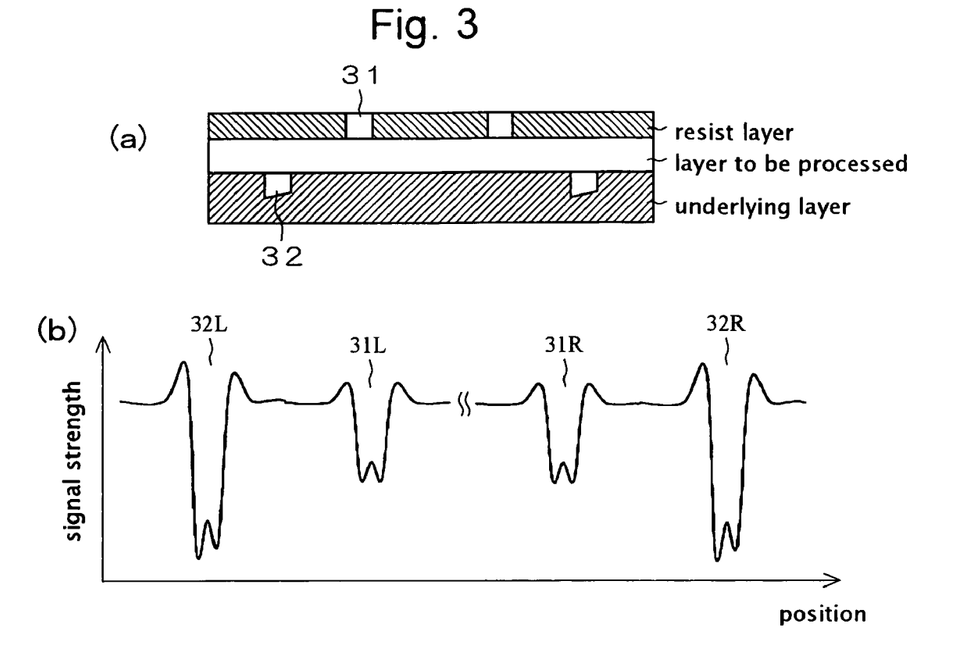
FIG. 3 is a diagram for showing a configuration (b) when the edge of an underlying mark 32 has asymmetry and shapes (c) of the edge waveforms 31L, 31R, 32L, and 32R.
Figure 4:
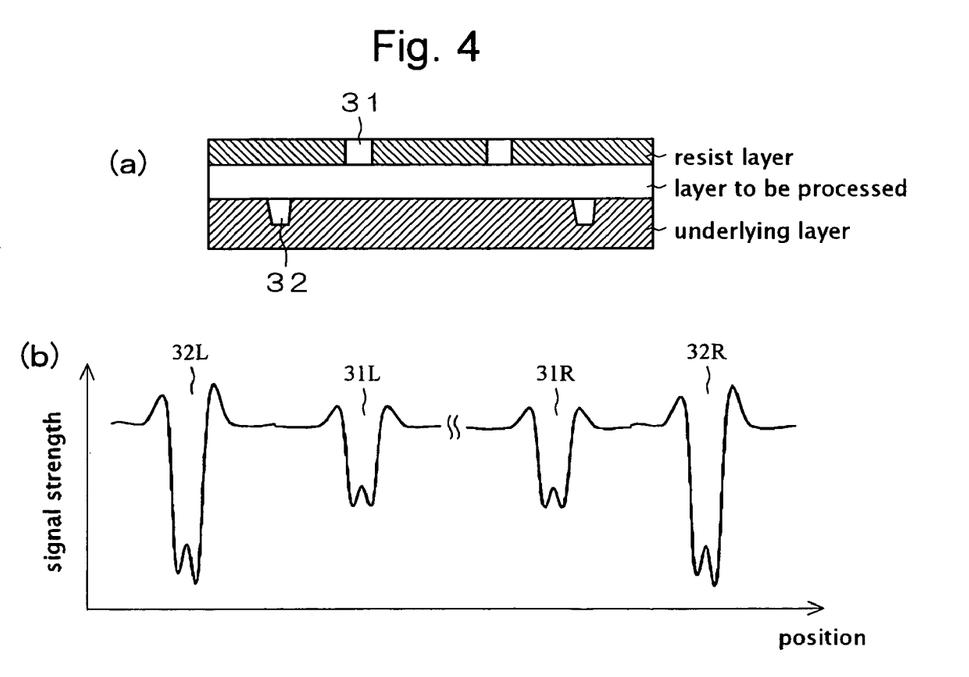
FIG. 4 is a diagram for showing a configuration (b) and shapes (c) of the edge waveforms 31L, 31R, 32L, and 32R; when the edge of the underlying mark 32 has asymmetry.

However, resulting from variations in the manufacturing process, the actual sectional shape of the underlying mark 32 may be uneven in the height (difference in level) of the edge at the left and right sides as shown in FIG. 3(a) or uneven in the gradient of the edge at the left and right sides as shown in FIG. 4(a). In this case, the asymmetry of the edge waveforms of the underlying mark 32 affects the edge shapes 32L and 32R to be distorted and have asymmetry as shown, for example, in FIG. 3(b) and FIG. 4(b). In a case where the position of center of gravity of the underlying mark 32 is detected by finding an overlay correlation between the asymmetric edge waveforms 32L and 32R and their reflection waveforms, the position of center of gravity is shifted depending on the degree of symmetry of the edge waveforms 32L and 32R. Because of this, it is not possible to obtain an accurate overlay displacement by finding a relative displacement between the position of center of gravity obtained from the overlay correlation calculation and the position of center of gravity of the resist mark 31 and by correcting WIS.

Figure 5:
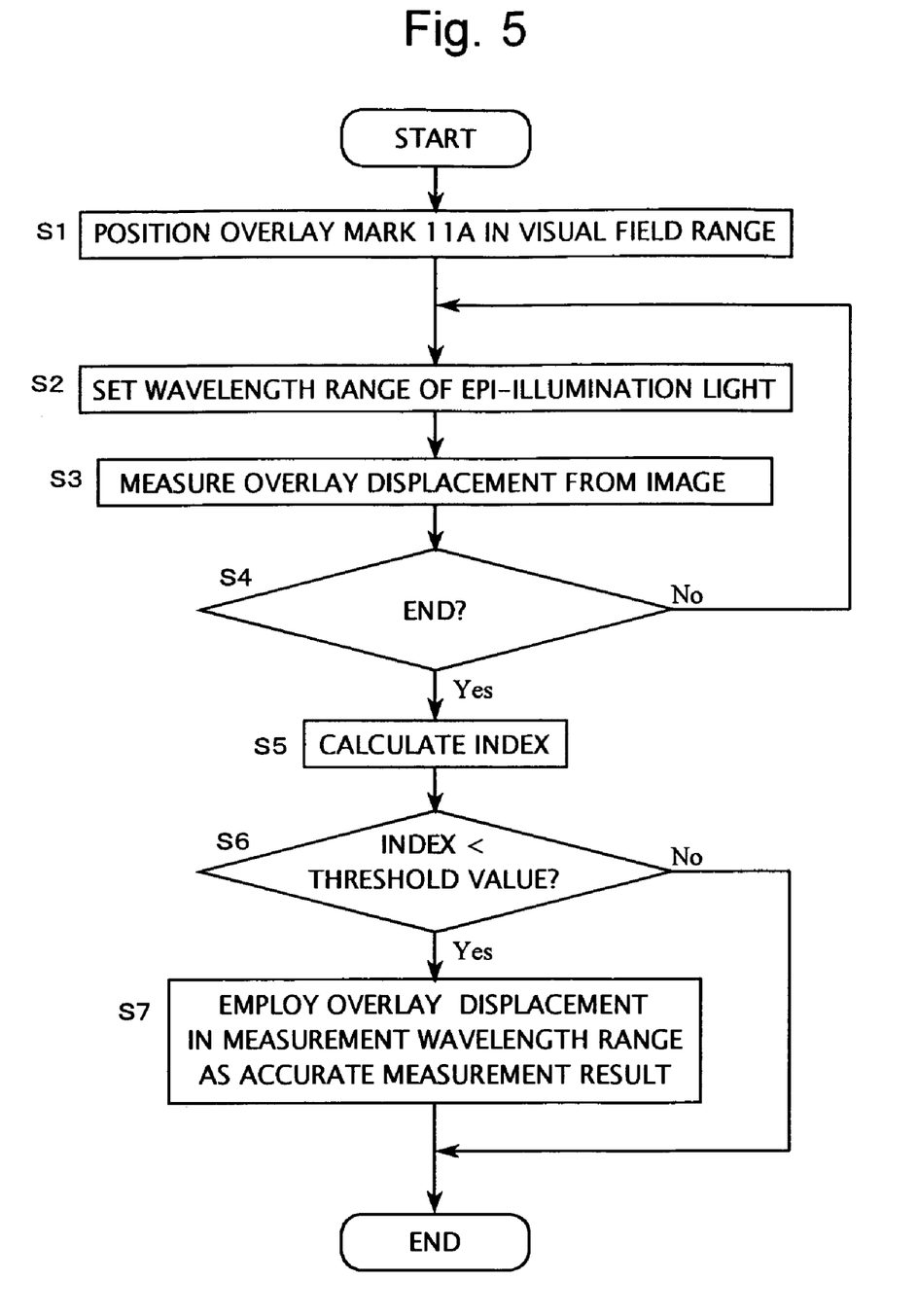
FIG. 5 is a flow chart showing a measurement procedure of the overlay measurement apparatus 10.

In view of this, the overlay measurement apparatus 10 in the present embodiment judges whether or not the overlay displacement obtained from an image is accurate by performing an overlay inspection in accordance with the procedure of the flow chart in FIG. 5.

The controlling section 17 of the overlay measurement apparatus 10 first (step S1) controls the stage 12 to position one of the overlay marks 11A of the substrate 11 in the illumination area. Next (step S2), it controls the wavelength switching mechanism 3B to set the wavelength range of the epi-illumination light to the substrate 11 to a "measurement wavelength range $\alpha$". For example, when the above-mentioned optical filter (3) is inserted into the illumination light path, the measurement wavelength range $\alpha$ will be 530 nm to 700 nm in accordance with its transmission wavelength range.

Next (step S3), the image of the overlay mark 11A is captured using the light in the measurement wavelength range $\alpha$, and the above-mentioned overlay correlation is calculated using the profile of the signal strength in the image in the measurement wavelength range $\alpha$, to find an overlay displacement $\Delta_\alpha$ between the resist mark 31 and the underlying mark 32. Then, in order to judge whether or not the overlay displacement $\Delta_\alpha$ in the measurement wavelength range $\alpha$ is accurate, the procedure returns to step S2 (when No in step S4) to repeat the same processing.

That is, in step S2 for the second time, the wavelength range of the epi-illumination light is set to an "evaluation wavelength range $\beta$" different from the "measurement wavelength range $\alpha$". For example, when the above-mentioned optical filter (2) is inserted into the illumination light path, the evaluation wavelength range $\beta$ will be 530 nm to 610 nm in accordance with the transmission wavelength range. This is on the short wave side of the measurement wavelength range $\alpha$ (530 nm to 700 nm).

In step S3 for the second time, the image of the overlay mark 11A is captured using the light in the evaluation wavelength range $\beta$ different from the measurement wavelength range $\alpha$, the similar calculation of overlay correlation is performed using the profile of the signal strength in the image in the evaluation wavelength range $\beta$, to find an overlay displacement $\Delta_\beta$ between the resist mark 31 and the underlying mark 32.

Further, the overlay measurement apparatus 10 in the present embodiment repeats the processing in steps S2 and S3 again (for the third time) and sets the wavelength range of the epi-illumination light to an "evaluation wavelength range $\gamma$" different from the above-mentioned wavelength range. For example, when the optical filter (8) is inserted, the evaluation wavelength range $\gamma$ in this case will be 610 nm to 700 nm. This is on the long wave side of the measurement wavelength range $\alpha$ (530 nm to 700 nm).

Similarly, also in step S3 for the third time, the image of the overlay mark 11A is captured using the light in the second evaluation wavelength range $\gamma$, the similar calculation of overlay correlation is performed using the profile of the signal strength in the image in the evaluation wavelength range $\gamma$, to find an overlay displacement $\Delta_\gamma$ between the resist mark 31 and the underlying mark 32.

As described above, after finding the overlay displacements $\Delta_\alpha$, $\Delta_\beta$, and $\Delta_\gamma$ in the wavelength ranges (the measurement wavelength range $\alpha$ and the two kinds of evaluation wavelength ranges $\beta$ and $\gamma$) determined in advance respectively (when Yes in step S4), the controlling section 27 proceeds to the processing in step S5. In step S5, based on the three overlay displacements $\Delta_\alpha$, $\Delta_\beta$, and $\Delta_\gamma$, an index for accuracy of the overlay displacement $\Delta_\alpha$ in the measurement wavelength range $\alpha$ is calculated.

It is preferable that the index is a numerical value that indicates the degree of variations in the three overlay displacements $\Delta_\alpha$, $\Delta_\beta$, and $\Delta_\gamma$. For example, the difference between the maximum value and the minimum value of the three overlay displacements $\Delta_\alpha$, $\Delta_\beta$, and $\Delta_\gamma$ may be determined as an index. The standard deviation of the three overlay displacements $\Delta_\alpha$, $\Delta_\beta$, and $\Delta_\gamma$ may also be determined as an index.

Here, the degree of variations in the overlay displacements $\Delta_\alpha$, $\Delta_\beta$, and $\Delta_\gamma$ depends on whether or not the degree of symmetry of the edge waveforms 32L and 32R (FIG. 2(c), FIG. 3(b), FIG. 4(b)) of the profile of signal strength in the image of the overlay mark 11A changes depending on the wavelength range of the epi-illumination light. Qualitatively, with a change in the wavelength range of the epi-illumination light, when the degree of symmetry of the edge waveforms 32L and 32R largely changes, the degree of variations in the overlay displacements $\Delta_\alpha$, $\Delta_\beta$, and $\Delta_\gamma$ becomes also large.

When the degree of symmetry of the edge waveforms 32L and 32R changes greatly depending on the wavelength range of the epi-illumination light, it can be thought that the edge of the underlying mark 32 is asymmetric (FIG. 3(a), FIG. 4(a)). When the height (difference in level) of the edge at the left side is different from that at the right side and the edge has asymmetry as shown in FIG. 3(a), the wavelength dependency of the symmetry of the edge waveforms 32L and 32R is as follows.

Figure 6:
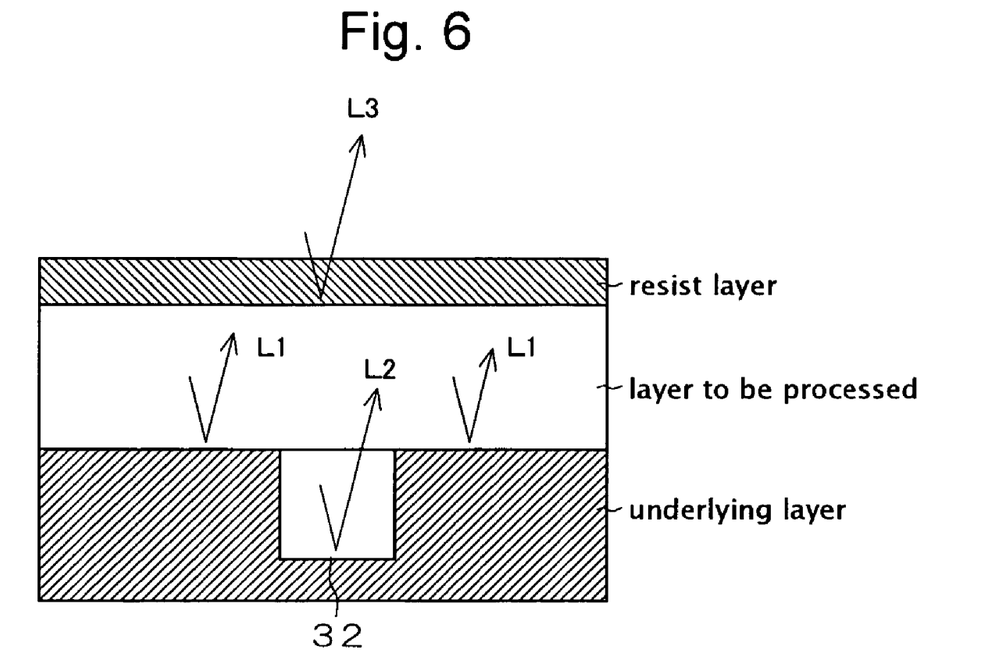
FIG. 6 is a diagram for showing reflected light L1, L2, etc., at the upper and lower sides of the edge of the underlying mark 32.

When the height of the edge is one quarter, three quarters, five quarters, . . . , of the illumination wavelength in the air medium, the phase of the reflected light L1 at the upper side of the edge is opposite to the phase of the reflected light L2 at the lower side thereof (FIG. 6). Therefore, the extinction ratio is largest in the vicinity of the edge at which both of the reflected lights mix with each other, and the edge waveforms 32L and 32R have a peak with a high contrast.

When the height of the edge is one half, two halves, three halves, . . . , of the illumination wavelength in the air medium, the phase of the reflected light L1 at the upper side of the edge is equal to phase of the reflected light L2 at the lower side thereof (FIG. 6), therefore, the extinction ratio in the vicinity of the edge at which both mix with each other is smallest, and the edge waveforms 32L and 32R have a peak with a low contrast.

As described above, the contrast of a peak in the edge waveforms 32L and 32R varies depending on the relationship between the height of the edge of the underlying mark 32 and the illumination wavelength. Therefore, when the height of the edges of the underlying mark 32 at the right and left sides is uneven as shown in FIG. 3(a), at the right and left edges the contrast with a peak changes differently due to the illumination wavelength and the degree of symmetry of the edge waveforms 32L and 32R changes depending on the illumination wavelength.

Further, the underlying mark 32 is observed via a plurality of transparent layers (a layer to be processed in FIG. 2(b)) and the reflected light L1 at the upper side of the edge interferes with the reflected light L3 (FIG. 6) at the transparent layer boundary surface, and the reflected light L2 at the lower side of the edge interferes with the above-mentioned reflected light L3. Because of this, it can be thought that the reflectivity with the interference with the reflected light L3 taken into consideration differs between the upper side and the lower side of the edge. Then, the difference in the reflectivity also changes depending on the illumination wavelength.

Based on the inference that a waveform with a weaker contrast is more sensitive to external disturbance, it can be inferred that when the reflected light L1 at the upper side of the edge is opposite in phase to the reflected light L2 at the lower side thereof, the closer to 1:1 the intensity ratio between the reflected light L1 and L2 gets, the larger the effect of interference, and the smaller the degree of change (degree of distortion) in the symmetry of the edge waveforms 32L and 32R depending on the illumination wavelength. Further, when the reflected light L1 and L2 has the same phase, the closer to 1:1 the intensity ratio between the reflected light L1 and L2 gets, the smaller the effect of interference and the larger the degree of change (degree of distortion) in the symmetry of the edge waveforms 32L and 32R depending on the illumination wavelength.

As described above, when the edges of the underlying mark 32 is asymmetric (FIG. 3(a), FIG. 4(a)), the degree of symmetry of the edge waveforms 32L and 32R changes greatly depending on the wavelength range of the epi-illumination light and variations in the overlay displacements $\Delta_\alpha$, $\Delta_\beta$, and $\Delta_\gamma$ also become large. Then, the closer to an ideal symmetric shape the edge of the underlying mark 32 has (FIG. 2(b)), the smaller the change in the degree of symmetry of the edge waveforms 32L and 32R even with the change in the wavelength range of the epi-illumination light and variations in the overlay displacements $\Delta_\alpha$, $\Delta_\beta$, and $\Delta_\gamma$.

Further, with large variations in the overlay displacements $\Delta_\alpha$, $\Delta_\beta$, and $\Delta_\gamma$, the edge waveforms 32L and 32R (FIG. 3(b), FIG. 4(b)) are asymmetric due to the above-mentioned asymmetric edges of the underlying mark 32 (FIG. 3(a), FIG. 4(a)), so that the overlay displacement $\Delta_\alpha$ in the measurement wavelength range α cannot be regarded as an accurate measurement result.

Furthermore, with small variations in the overlay displacements $\Delta_\alpha$, $\Delta_\beta$, and $\Delta_\gamma$, the edge waveforms 32L and 32R are symmetric (FIG. 2(c)) due to the above-mentioned symmetric edges of the underlying mark 32 (FIG. 2(b)), so that the overlay displacement $\Delta_\alpha$ in the measurement wavelength range α can be regarded as an accurate measurement result.

Accordingly, the overlay measurement apparatus 10 in the present embodiment calculates an index for the accuracy (likelihood of being accurate) of the overlay displacement $\Delta_\alpha$ in the measurement wavelength range α from the three overlay displacements $\Delta_\alpha$, $\Delta_\beta$, and $\Delta_\gamma$ in step S5 in FIG. 5, and then proceeds to the next step S6 where the index is compared with a predetermined threshold value.

When the result of comparison shows that the index is less than the threshold value (Yes in step S6), variations in the overlay displacements $\Delta_\alpha$, $\Delta_\beta$, and $\Delta_\gamma$ are small, so that the overlay displacement $\Delta_\alpha$ in the measurement wavelength range α is employed as an accurate measurement result (step S7). Conversely, when the index is equal to or greater than the threshold value (No in step S6), the processing in FIG. 5 is ended since variations in the overlay displacements $\Delta_\alpha$, $\Delta_\beta$, and $\Delta_\gamma$ are large, without employing the overlay displacement $\Delta_\alpha$ in the measurement wavelength range α as an accurate measurement result.

Thereafter, the overlay measurement apparatus 10 in the present embodiment positions the overlay mark 11A at other measurement points on the substrate 11 sequentially in the illumination area according to the recipe and repeats the same processing as that in FIG. 5. This makes it possible to employ as an accurate measurement amount only the overlay displacements $\Delta_\alpha$, $\Delta_\beta$, and $\Delta_\gamma$ with small variations among the overlay displacements $\Delta_\alpha$ in the measurement wavelength range α obtained sequentially at a number of measurement points.

As described above, according to the overlay measurement apparatus 10 in the present embodiment, it is possible to judge whether or not the overlay displacement $\Delta_\alpha$ in the measurement wavelength range α is accurate since a numeric value (index) that indicates the degree of variations is calculated after the overlay displacements $\Delta_\alpha$, $\Delta_\beta$, and $\Delta_\gamma$ are found from the mark image in the evaluation wavelength rangs β and γ in addition to the measurement wavelength range α. Because of this, it is possible to employ only accurate measurement results under a stable manufacturing process, excluding measurement results when there is a fluctuation in the manufacturing process.

Variations in the manufacturing process may occur in unit of lot (substrate 11), however, it is possible to successively monitor the accuracy of the overlay displacement $\Delta_\alpha$ in the measurement wavelength range α, coping with such variations. Therefore, it is possible to generate, for feedback, correction data (offset components, scaling components, etc.) for an exposure device by use of only the accurate overlay displacements $\Delta_\alpha$ after selected by the above-mentioned index, thus contributing to an increase in the yield in the manufacturing process.

Further, the overlay measurement apparatus 10 in the present embodiment sets the evaluation wavelength ranges β and γ on both of the short wave side and the long wave side in the measurement wavelength range α, respectively, finds the respective overlay displacements $\Delta_\beta$ and $\Delta_\gamma$ in the evaluation wavelength ranges β and γ, and calculates the index for the accuracy of the overlay displacement $\Delta_\alpha$ in the measurement wavelength range α. This accordingly improves the accuracy of the index.

(Modifications)

In the above-mentioned embodiment, the evaluation wavelength ranges β and γ are set on the short wave side and the long wave side in the measurement wavelength range α, however, the present invention is not limited thereto. The same effects is attainable by applying the present invention not only to a case where the entire evaluation wavelength ranges β and γ are included in the measurement wavelength range α, but also to a case where the evaluation wavelength ranges β and γ are set astride the inside and outside of the measurement wavelength range α, or to a case where the evaluation wavelength ranges β and γ are set outside the measurement wavelength range α.

Further, the present invention can be applicable to a case where the evaluation wavelength ranges β and γ are set on both of the short wave side and the long wave side in the measurement wavelength range α as well as to a case where they are set on either of the short wave side and the long wave side, as long as the number of evaluation wavelength ranges is one or more.

Furthermore, the above-mentioned embodiment has described the example in which it is judged whether or not the overlay displacement $\Delta_\alpha$ in the measurement wavelength range α is accurate based on the index found from the overlay displacements $\Delta_\alpha$, $\Delta_\beta$, and $\Delta_\gamma$, however, the present invention is not limited thereto. As can be seen from the above-mentioned description, the index found from the overlay displacements $\Delta_\alpha$, $\Delta_\beta$, and $\Delta_\gamma$ reflects the edge shape of the underlying mark 32, so that it is possible to indirectly monitor the edge shape of the pattern of the underlying layer. In other words, it is also possible to perform a defect inspection of the pattern of the substrate 11 based on the index found from the overlay displacements $\Delta_\alpha$, $\Delta_\beta$, and $\Delta_\gamma$.

In the above-mentioned embodiment, the wavelength switching mechanism 3B is provided in the light source section 13 in the illumination optical system (13-19), however, the present invention is not limited thereto. The same wavelength switching mechanism may be arranged between the aperture stop 14 and the beam splitter 18. Further, a wavelength selection filter may be arranged on the image forming side using white light as epi-illumination light. In this case too, it is only necessary to repeat measurement of the overlay displacements through the same procedure as that described above.

The invention is not limited to the above embodiments and various modifications may be made without departing from the spirit and scope of the invention. Any improvement may be made in part or all of the components.

What is claimed is:

1. An overlay measurement apparatus comprising:
   a light source that emits light having a wide wavelength band;
   a wavelength switching mechanism, arranged in the illumination light path, that switches light emitted from said light source to light in a measurement wavelength range having a predetermined wavelength range or light in an evaluation wavelength range having a wavelength range different from said measurement wavelength range;
   a first measuring unit that captures images of a first mark and a second mark formed in different layers of a substrate illuminated by light in said measurement wavelength range being switched by said wavelength switching mechanism, and finds an overlay displacement between the first mark and the second mark based on the images in the measurement wavelength range;
   a second measuring unit that captures the images of said first mark and said second mark illuminated by light in said evaluation wavelength range being switched by said wavelength switching mechanism, and finds an overlay displacement between said first mark and said second mark based on the images in the evaluation wavelength range; and
   a calculation unit that calculates an index for accuracy of the overlay displacement in said measurement wavelength range according to the overlay displacement in said measurement wavelength range found by said first measuring unit and to the overlay displacement in said evaluation wavelength range found by said second measuring unit.

2. The overlay measurement apparatus according to claim 1, wherein:
   said second measuring unit sets said evaluation wavelength range on both of a short wave side and a long wave side of said measurement wavelength range, and finds the overlay displacement in each of the evaluation wavelength ranges; and
   said calculation unit calculates said index according to the overlay displacement in said measurement wavelength range and respective overlay displacements in a plurality of the evaluation wavelength ranges.

3. The overlay measurement apparatus according to claim 1, wherein said calculation unit calculates as said index a difference between maximum and minimum values of the overlay displacements found by said first measuring unit and said second measuring unit.

4. The overlay measurement apparatus according to claim 2, wherein said calculation unit calculates as said index a difference between maximum and minimum values of the overlay displacements found by said first measuring unit and said second measuring unit.

5. The overlay measurement apparatus according to claim 1, wherein said calculation unit calculates as said index a standard deviation of the overlay displacements found by said first measuring unit and said second measuring unit.

6. The overlay measurement apparatus according to claim 2, wherein said calculation unit calculates as said index a standard deviation of the overlay displacements found by said first measuring unit and said second measuring unit.

7. The overlay measurement apparatus according to claim 1, wherein said light source and said wavelength switching mechanism constitute a light source unit, said light source is formed of a white light source, and said wavelength switching mechanism includes a plurality of optical filters and each of said optical filters is formed to transmit light in different transmission wavelength ranges.

8. The overlay measurement apparatus according to claim 7, wherein said light source unit is connected to said overlay measurement apparatus by a light guide fiber.

9. A measurement apparatus comprising:

a light source that emits light having a wide wavelength band;

a wavelength switching mechanism, arranged in the illumination light path, that switches light emitted from said light source to light in a measurement wavelength range having a predetermined wavelength range or light in an evaluation wavelength range having a wavelength range different from said measurement wavelength range;

a first measuring unit that captures images of a measuring object of a substrate illuminated by light in said measurement wavelength range being switched by said wavelength switching mechanism, and measures said measuring object based on the image in the measurement wavelength range;

a second measuring unit that captures images of the measuring object of the substrate illuminated by light in said evaluation wavelength range being switched by said wavelength switching mechanism, and measures said measuring object based on the image in the evaluation wavelength range; and a calculation unit that calculates an index for accuracy of a measurement in said measurement wavelength range according to the first measurement in said measurement wavelength range found by said first measuring unit and according to a second measurement in said evaluation wavelength range found by said second measuring unit.

* * * * *